United States Patent Office 3,382,109

Patented May 7, 1968

3,382,109
BRAZING LEAD TELLURIDE THERMOELECTRIC GENERATOR ELEMENTS

Louis F. Kendall, Jr., Scotia, and James H. Bredt, Schenectady, N.Y., assignors to General Electric Company, a corporation of New York No Drawing. Filed Oct. 9, 1964, Ser. No. 402,950
10 Claims. (Cl. 136—237)

ABSTRACT OF THE DISCLOSURE

In the manufacture of lead telluride thermoelectric generators, it is customary to join the lead telluride elements to ferrous metal bridging members by brazing techniques. It would be advantageous to use tin telluride as the brazing material except that a brittle layer is formed at the tin telluride-ferrous metal interface which cause mechanical failure of the joint when thermally cycled. It has been found that the presence of a small but effective amount of antimony at the interface eliminates the brittle layer and produces a satisfactory joint which is thermally stable and which has a low junction electrical resistance.

This invention relates to the thermoelectric generation of power and particularly to the improved fabrication of generator elements comprising lead telluride.

Lead telluride thermocouples for the direct conversion of heat energy to electric energy have been known for some time. Superficially, these thermocouples operate in the same manner as earlier developed "metal" thermocouples, such as chromel-alumel, iron-constantan, and platinum-platinum-rhodium, for example. In detail, however, the lead telluride thermocouple is quite different from the metal thermocouples in that it is a semiconductive device and has a thermoelectric heat conversion efficiency of up to ten times that of the metal thermocouples. For a more detailed discussion of these semiconductive thermocouples see "Direct Conversion of Heat to Electricity," edited by Kay and Welch, John Wiley and Sons, Inc., New York, 1960, ch. 16, p. 16–5, and "AIEE Transactions," vol. 79, pt. I, 1960, pp. 817–820.

In general, these thermocouples have been made by establishing an electrical connection between a p-type lead telluride semiconductor body and an n-type lead telluride semiconductor body by means of a conductive metallic bridging element. Usually, the two lead telluride bodies are arranged in spaced relationship in contact with one side of a plate-like body of the metal bridging element which functions to establish an electrically conductive path between the two lead telluride bodies and as a heat transfer medium. This three-piece assembly constitutes the hot junction of the thermocouple. The ends of the lead telluride bodies remote from the bridging member are each connection to a conductor for connection to the circuit or electrical device utilizing the generated power. Obviously, a plurality of such hot junctions may utilize heat from a common source and their individual outputs may be connected in series or parallel into a common circuit, if desired.

Unfortunately, a number of difficulties have been encountered which have prevented the practical application of these thermocouples. A principal difficulty has been in the inability to produce a reliable low resistance electrical contact between the lead telluride elements and the bridging member. This difficulty has been particularly acute with respect to the p-type lead telluride. Prior to this invention, the most satisfactory solution to this problem has been the brazing technique disclosed by Weinstein and Mlavsky, "Review of Scientific Instruments," vol. 33, p. 1119 (1962). In this technique, a brazing material, tin telluride, is interposed between the lead telluride body and a substantially pure iron bridging member and the members secured together by fusion and subsequent solidification of the brazing member. A good bond having low electrical resistance may thereby be achieved which maintains its integrity at elevated temperatures encountered in use so long as it is not subjected to thermal cycling. If a hot junction formed in this manner is subjected to heating to about 600° C. followed by cooling to less than 100° C. in a repeated cyclical manner, the brazed joint fails after a relatively few heating and cooling cycles. This failure has been found to originate at the tin telluride-iron interface and is due to the presence of a brittle layer.

It is, therefore, a principal object of this invention to provide a low electrical resistance bond between lead telluride electrode members and iron-base materials which maintains its integrity under thermal cycling.

It is a further object of this invention to provide a thermocouple hot junction assembly comprising lead telluride electrode members and a ferrous metal bridging member which is stable under thermal cycling and which has a low junction electrical resistance.

It is yet a further object of this invention to provide a brazed joint between lead telluride electrode members and ferrous base members which retains its integrity during thermal cycling, has low electrical resistance, in which the coefficients of thermal expansion of the materials are closely matched, and which does not result in the degradation of properties of the lead telluride.

Other and different objects of this invention will become apparent to those skilled in the art from the following disclosure.

Briefly stated, in accordance with one embodiment of this invention a brazed joint is formed between a lead telluride electrode element and a metallic member comprised mainly of iron, which brazed joint includes a layer of tin telluride between the lead telluride and iron-base members and being characterized by the presence at the iron-tin telluride interface of a small but effective amount of antimony.

More particularly, the invention may best be illustrated by the following specific examples.

Example 1

Lead telluride electrodes having a right circular cylindrical configuration ¼ inch in diameter and ¼ inch long were brazed to commercial ingot iron sheet in the following manner. The iron sheet was supported in a horizontal position in a protective argon atmosphere furnance and elemental antimony was melted on its surface and baked thereon at about 900° C. for 1 hour to cause diffusion of some antimony into the surface of the iron sheet. The excess antimony was removed from the surface of the iron sheet and tin telluride (SnTe) was melted on the surface at the same location where the antimony was melted. The excess tin telluride was removed, the sheet cooled to below the tin telluride melting point leaving a layer of solid tin telluride about 0.002 inch thickness on the plate, and the lead telluride cylinder bases positioned on the sheet upon the film of solid tin telluride. In this, both p- and n-type lead telluride cylinders were employed. The sheet and cylinders were raised to a temperature just above the melting point of the tin telluride, held for about 10 minutes at 850° C., and then cooled, effectively brazing the lead telluride cylinders to the iron sheet. The resulting brazed joints were found to have a very low resistance of the order of about 10 microohms centimeters squared or less. These brazed joints were then subjected to thermal cycling consisting of alternately heating to about 600° C. in about 12 minutes, and cooling to a temperature of about 12° C. in about 25 to 30 minutes. This thermal cycle was repeated 50 times with no evidence of bond degradation. When brazed joints were made in the same manner but with the antimony omitted, the joints fractured after only a few thermal cycles, none withstanding more than 10 such cycles. Upon examination of the fractures, it appeared that a brittle zone or layer had formed at the iron-tin telluride interface. Sections made of the antimony treated brazed joints of this invention revealed no such brittle zone.

In the foregoing example as well as in the following examples, it is to be understood that all of the heating steps are done in a substantially oxygen-free ambient. This may be accomplished by heating in a vacuum of about $10^{-6}$ mm. of mercury to a temperature just below the maximum to be employed, back-filling the furnace chamber with an inert gas, such as argon, and completing the heating step under the inert atmosphere.

Example 2

In this case, antimony was not only applied directly to the surface of the iron sheet as in Example 1, but was also supplied to the iron-tin telluride interface by incorporating a small amount of antimony in the brazing alloy. The tin telluride brazing alloy had a composition of $Sn_{1.000}Te_{1.016}Sb_{0.012}$. For every mole of stoichiometric SnTe there was 0.00533 mole of $Sb_2Te_3$ and 0.00133 mole of free antimony. The steps recited in Example 1 were repeated and again a satisfactory low resistance joint was formed which did not degrade upon thermal cycling.

Upon microscopic examination of the lead telluride electrode bodies brazed to the ingot iron sheet following the thermal cycling test, it was observed that fine cracks had developed in the bodies of the lead telluride, even though the brazed joints were sound. The formation of these cracks is believed to be caused by a lack of "match" of the coefficients of thermal expansion of the lead telluride and the iron-base material. The thermal expansion coefficient of ingot iron is $14 \times 10^{-6}/°$ C. and that of lead telluride is $21 \times 10^{-6}/°$ C., both in the 32–1200° F. temperature range. The thermal expansion coefficients of the AISI 300 Series stainless steels on the other hand are much higher. For example, Type 302 stainless steel has a thermal expansion coefficient of $18.7 \times 10^{-6}/°$ C., Type 304 is $18.7 \times 10^{-6}/°$ C., and Type 347 is $19.1 \times 10^{-6}/°$ C., all for the 32–1200° F. temperature range. However, when lead telluride thermoelements were brazed to Type 347 stainless steel, the bulk electrical properties of the lead telluride was severely degraded by the brazing operation even though the brazed joints were mechanically sound. In view of the fact that the degradation of electrical properties of the lead telluride was quite uniform throughout the bulk of the lead telluride bodies, it appeared that the source of the trouble lay in the contamination of the ambient atmosphere by volatile material having its origin in the steel and did not occur through solid state diffusion from the brazed interface. When the and that the bulk electrical properties of the lead telluride had not been impaired.

From all the foregoing, it will be apparent that by the use of a small but effective amount of antimony at the ferrous base metal-tin telluride interface, a final brazed joint between lead telluride and the ferrous base metal is provided which has low electrical resistance and is not subject to mechanical failure through thermal cycling. Further, that by the elimination of contaminating volatile matter from the ferrous base material, these improved brazed joints may be used with ferrous materials having a coefficient of thermal expansion much closer to that of the lead telluride, thereby minimizing the generation of internal stresses in the lead telluride during thermal cycling. Thermocouple hot junctions made according to Examples 1 to 3 were found to have excellent thermo-electric properties.

It will be appreciated that the several specific examples disclosed are for the purpoe of illustration only and that many variations within the scope of the invention will readily occur to those skilled in the art. For example, the antimony might be introduced to the iron alloy-tin telluride interface by sputtering or by flame spraying, or any other equivalent method. Other means than vacuum baking might be employed to either remove the objectionable materials from the stainless steels, or to manufacture the steel by methods which effectively exclude the objectionable material. Further, the process parameters such as the time-temperature relationship of the various heat treatments and the level of pressure employed in the vacuum steps may be varied from those specifically disclosed in the several examples if desired. It is, therefore, intended that the scope of this invention not be limited except as defined by the appended claims.

What we claim as new and desire to secure by Letters Patent of the United States is:

1. A manufacture comprising a lead telluride member, a ferrous metal member, a layer of tin telluride interposed between the lead telluride member and the ferrous metal member and fused to each member and a small but effective amount of elemental antimony at the tin telluride-ferrous metal interface.

2. A manufacture as set forth in claim 1 in which said lead telluride member is a semiconductor of the p-type.

3. A manufacture as set forth in claim 1 in which said lead telluride member is a semiconductor of the n-type.

4. A manufacture as set forth in claim 1 in which said ferrous metal member comprises a commercially pure open hearth iron.

5. A manufacture as set forth in claim 1 in which said ferrous metal member comprises an AISI 300 Series type stainless steel.

6. A manufacture as set forth in claim 1 in which said layer of tin telluride contains a small but effective amount of free antimony.

member to be brazed, applying a thin layer of tin telluride to the same area, placing the lead telluride member in physical contact with the tin telluride layer, heating the tin telluride to its melting point and cooling to solidify the tin telluride to effectively bond the lead telluride member to the ferrous metal member by means of a brazed joint.

9. The method recited in claim 8 in which the tin telluride contains a small but effective amount of elemental antimony.

10. The method recited in claim 8 in which the ferrous metal member is an AISI 300 Series type stainless steel which has been heated in a vacuum at a temperature and for a time sufficient to remove volatile materials therefrom before the antimony is applied thereto.

References Cited

UNITED STATES PATENTS

| | | | |
|---|---|---|---|
| 3,037,064 | 5/1962 | Rosi et al. | 136—237 |
| 3,203,772 | 8/1965 | Intrater | 29—195 |
| 3,232,719 | 2/1966 | Ritchie | 136—201 X |

ALLEN B. CURTIS, *Primary Examiner.*

WINSTON A. DOUGLAS, *Examiner.*